United States Patent
Kwag et al.

(10) Patent No.: US 10,438,981 B2
(45) Date of Patent: Oct. 8, 2019

(54) IMAGE SENSOR

(71) Applicant: SK hynix Inc., Gyeonggi-do (KR)

(72) Inventors: Pyong-Su Kwag, Gyeonggi-do (KR);
Young-Jun Kwon, Gyeonggi-do (KR);
Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 179 days.

(21) Appl. No.: 15/251,998

(22) Filed: Aug. 30, 2016

(65) Prior Publication Data

US 2017/0338264 A1    Nov. 23, 2017

(30) Foreign Application Priority Data

May 23, 2016   (KR) .................. 10-2016-0062759

(51) Int. Cl.
*H01L 27/146* (2006.01)
*H01L 29/423* (2006.01)
*H01L 29/786* (2006.01)
*H04N 5/378* (2011.01)

(52) U.S. Cl.
CPC .... *H01L 27/14614* (2013.01); *H01L 29/4236* (2013.01); *H01L 29/78675* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 9,018,688 B2 * | 4/2015 | Yamaguchi | ......... H01L 27/1464 |
| | | | 257/292 |
| 9,564,463 B2 * | 2/2017 | Ihara | ................. H01L 27/14605 |
| 2014/0347538 A1 | 11/2014 | Toda | |
| 2015/0243700 A1 * | 8/2015 | Morooka | .......... H01L 27/14643 |
| | | | 257/292 |
| 2016/0020237 A1 * | 1/2016 | Yamakawa | ............ H04N 5/374 |
| | | | 257/233 |

* cited by examiner

*Primary Examiner* — Ali Naraghi
(74) *Attorney, Agent, or Firm* — IP & T Group LLP

(57) ABSTRACT

An image sensor, comprising: a photoelectric conversion element; a transfer transistor formed over the photoelectric conversion element; and a reset transistor formed over the photoelectric conversion element, formed substantially at the same level as the transfer transistor, and spaced apart from the transfer transistor by a gap, wherein the transfer transistor and the reset transistor are trench-type transistors and are symmetrical structure to each other with respect to the gap, wherein the photoelectric conversion element is a continuous layer under both the transfer transistor and the reset transistor, and is completely below the transfer transistor and the reset transistor.

15 Claims, 7 Drawing Sheets

IMAGE SENSOR

CROSS-REFERENCE TO RELATED APPLICATION(S)

The present application claims priority to Korean Patent Application No. 10-2016-0062759, filed on May 23, 2016, which is herein incorporated by reference in its entirety.

BACKGROUND

Exemplary embodiments of the present invention relate to a semiconductor device fabrication technology, and more particularly, to an image sensor.

An image sensor converts an optical image into an electrical signal. Recently, due to developments in the computer and communication industries, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor having improved performance.

In an embodiment, an image sensor may include a photoelectric conversion element; a transfer transistor formed over the photoelectric conversion element; and a reset transistor formed over the photoelectric conversion element, formed substantially at the same level as the transfer transistor, and spaced apart from the transfer transistor by a gap, wherein the transfer transistor and the reset transistor are configured symmetrical to each other with respect to the gap The transfer transistor may include: a first insulating layer formed over the photoelectric conversion element; a first conductive layer formed over the first insulating layer; a first open portion formed through the first insulating layer and the first conductive layer to expose the photoelectric conversion element; a first channel layer formed in the first open portion, and contacting the photoelectric conversion element and the first conductive layer; and a first gate formed over the first channel layer. The reset transistor may include: a second insulating layer formed over the photoelectric conversion element; a second conductive layer formed over the second insulating layer; a second open portion formed through the second insulating layer and the second conductive layer to expose the photoelectric conversion element; a second channel layer formed in the second open portion and contacting the photoelectric conversion element and the second conductive layer; and a second gate formed over the second channel layer. The first gate may include: a first gate insulating layer formed over the first channel layer; and a first gate electrode formed over the fire gate insulating layer and filling the first open portion. The second gate may include: a second gate insulating layer formed over the second channel layer; and a second gate electrode formed over the second gate insulating layer and filling the second open portion. The first channel layer may include undoped polysilicon or P type polysilicon, and wherein the second channel layer may include undoped polysilicon or P type polysilicon. The first channel layer may include N type polysilicon, and wherein the second channel layer may include N type polysilicon.

The photoelectric conversion element located under the transfer transistor may have the same size as the photoelectric conversion element located under the reset transistor. The gap may be formed over the photoelectric conversion element and may have a line shape which comprises a central point of the photoelectric conversion element and extends in a row direction, column direction or diagonal direction.

In an embodiment, an image sensor may include a photoelectric conversion element; an insulating layer formed over the photoelectric conversion element; a first conductive layer formed over the insulating layer; a second conductive layer formed over the insulating layer, formed at the same level as the first conductive layer, spaced apart from the first conductive layer by a gap, and configured symmetrical to the first conductive layer with respect to the gap; a first open portion formed through the first conductive layer and the insulating layer to expose the photoelectric conversion element; a second open portion formed through the second conductive layer and the insulating layer to expose the photoelectric conversion element, and configured symmetrical to the first open portion with respect to the gap; a first channel layer formed in the first open portion and contacting the photoelectric conversion element and the first conductive layer; a second channel layer formed in the second open portion, contacting the photoelectric conversion element and the second conductive layer, and configured symmetrical to the first channel layer with respect to the gap; a transfer gate formed over the first channel layer and filling the first open portion; and a reset gate formed over the second channel layer, filling the second open portion, and configured symmetrical to the transfer gate with respect to the gap.

The transfer gate may include: a first gate insulating layer formed over the first channel layer; and a first gate electrode formed over the first gate insulating layer and filling the first open portions The reset gate may include: a second gate insulating layer formed over the second channel layer; and a second gate electrode formed over the second gate insulating layer and filling the second open portion. The first conductive layer and the second conductive layer may be formed of the same material as each other, wherein the first channel layer and the second channel layer may be formed of the same material as each other, and wherein the transfer gate and the reset gate may be formed of the same material as each other. Each of the first channel layer and the second channel layer may include undoped polysilicon or P type polysilicon. Each of the first channel layer and the second channel layer may include N type polysilicon. The photoelectric conversion element covered by the first conductive layer may have the same size as the photoelectric conversion element covered by the second conductive layer. The gap may be formed over the photoelectric conversion element and may have a line shape which comprises a central point of the photoelectric conversion element and extends in a row direction, column direction or diagonal direction.

In an embodiment, an image sensor may include a first node receiving a first voltage; a second node receiving a second voltage; a third node coupled between the first node and the second node; a photoelectric conversion element coupled between the third node and the second node; a reset transistor coupled between the third node and the first node; a transfer transistor between the third node and a fourth node; and a floating diffusion coupled between the second node and the fourth node. The image sensor may further include a drive transistor including a first gate, a first source/drain, and a second source/drain, wherein the first gate is coupled to the fourth node, wherein the first source/drain is coupled to the first node, wherein the second source/drain is coupled to a column line; and a selection transistor including a second gate, a third source/drain, and a fourth source/drain, wherein the second gate is coupled to a row line, wherein the third source/drain is coupled to the second source/drain of the drive transistor, wherein the fourth source/drain is coupled to the column line.

The transfer transistor and the reset transistor may be symmetrical structure and may have substantially the same structure as each other. The first voltage may have a higher level than the second voltage.

DETAILED DESCRIPTION

Figure 1:
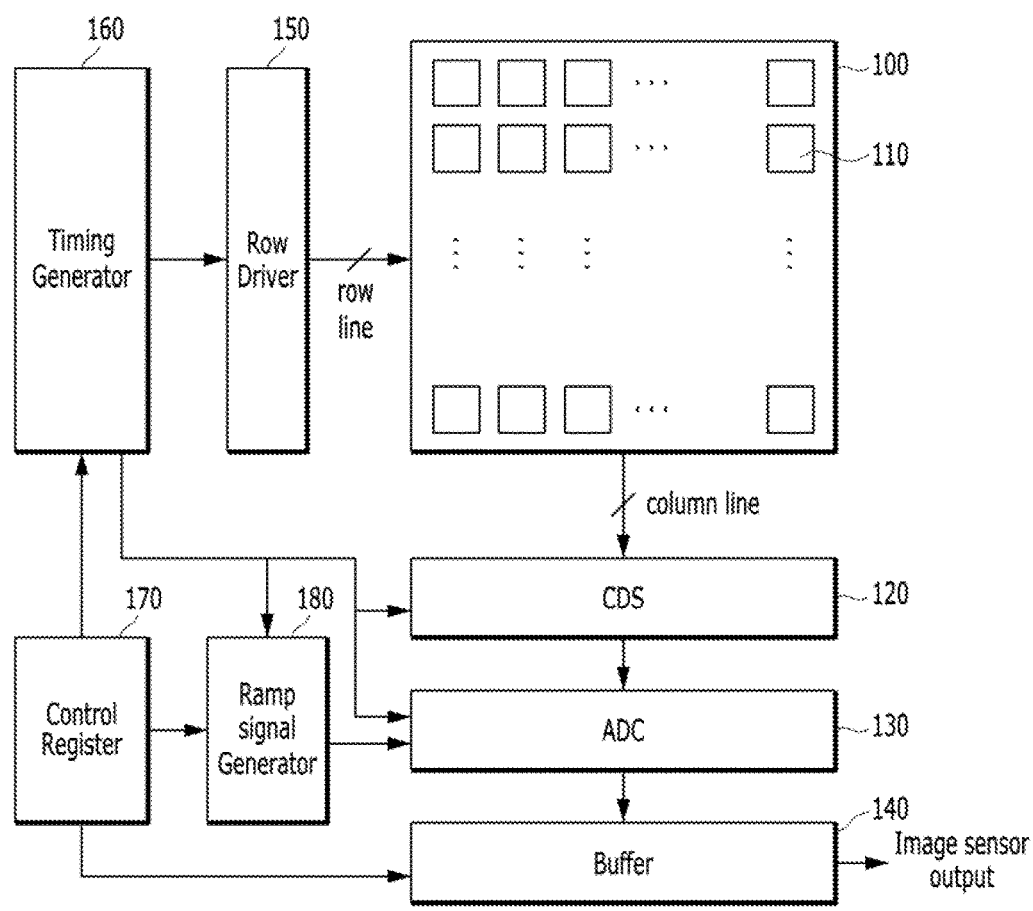
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Embodiments of the present invention to be described later relate to an image sensor having improved performance and a method for driving the same. In this case, the image sensor having improved performance may mean an image sensor capable of providing an image of a high pixel/high quality. In order to provide an image of a high pixel, there is a need for an image sensor in which a plurality of unit pixels have been integrated within a limited area. Furthermore, to provide an image of high quality, there is a need for an image sensor capable of preventing the deterioration of characteristics attributable to the high degree of integration of a plurality of unit pixels. Accordingly, an image sensor in accordance with an embodiment may include a plurality of unit pixels, each including a transfer transistor having a vertical channel and a reset transistor having a vertical channel. The transfer transistor and the reset transistor may have a symmetrical structure. Furthermore, the transfer transistor and the reset transistor may have their photoelectric conversion elements vertically overlapped.

FIG. 1 is a block diagram schematically illustrating an image sensor in accordance with an embodiment of the present invention. As illustrated in FIG. 1, the image sensor may include a pixel array 100, a correlated double sampling (CDS) unit 120, an analog-digital converter (ADC) 130, a buffer 140, a row driver 150, a timing generator 160, a control register 170 and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160 and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform sampling in response to the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130 and then sense and amplify the digital signals. Thus, the buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

In this case, in order to provide an image of a high pixel, the number of unit pixels 110 integrated within the, pixel array 100 may need to be increased. That is, more unit pixels 110 need to be disposed within a limited area. To this end, the physical size of the unit pixel 110 needs to be reduced. However, the image sensor operates based on a pixel signal generated from each of the unit pixels 110 in response to incident light. If the physical size of the unit pixel 110 is reduced, characteristics are inevitably deteriorated since the number of photons received by the unit pixel 100 is reduced.

Furthermore, each of the unit pixels 110 may include a photoelectric conversion element configured to generate photocharges in response to incident light and an output circuit configured to output an image signal in response to the generated photocharges. The output circuit may include a plurality of pixel transistors. More specifically, the plurality of pixel transistors may include a transfer transistor Tx, a reset transistor Rx, a drive transistor Dx and a selection transistor Sx. For reference, the drive transistor Dai is also called a source follower transistor.

In this case, characteristics may be deteriorated since the plurality of pixel transistors of each of the unit pixels 110 has different forms and sizes. More specifically, the transfer transistor Tx configured to transfer photocharges generated by the photoelectric conversion element to a floating diffusion FD and the reset transistor Rx configured to reset the floating diffusion FD have different forms and sizes. Accordingly, the amount of charges introduced into the floating diffusion FD when the reset transistor Rx switches and the amount of charges introduced into the floating diffusion FD when the transfer transistor Tx switches are different. This may deteriorate quality of an image since a noise is increased in an image signal and image reset signal generated by each unit pixel 110.

Accordingly, an image sensor capable of facilitating the high degree of integration and preventing the deterioration of characteristics attributable to an increase of the degree of integration in accordance with an embodiment of the present invention is described below in detail with reference to related drawings.

Figure 2:
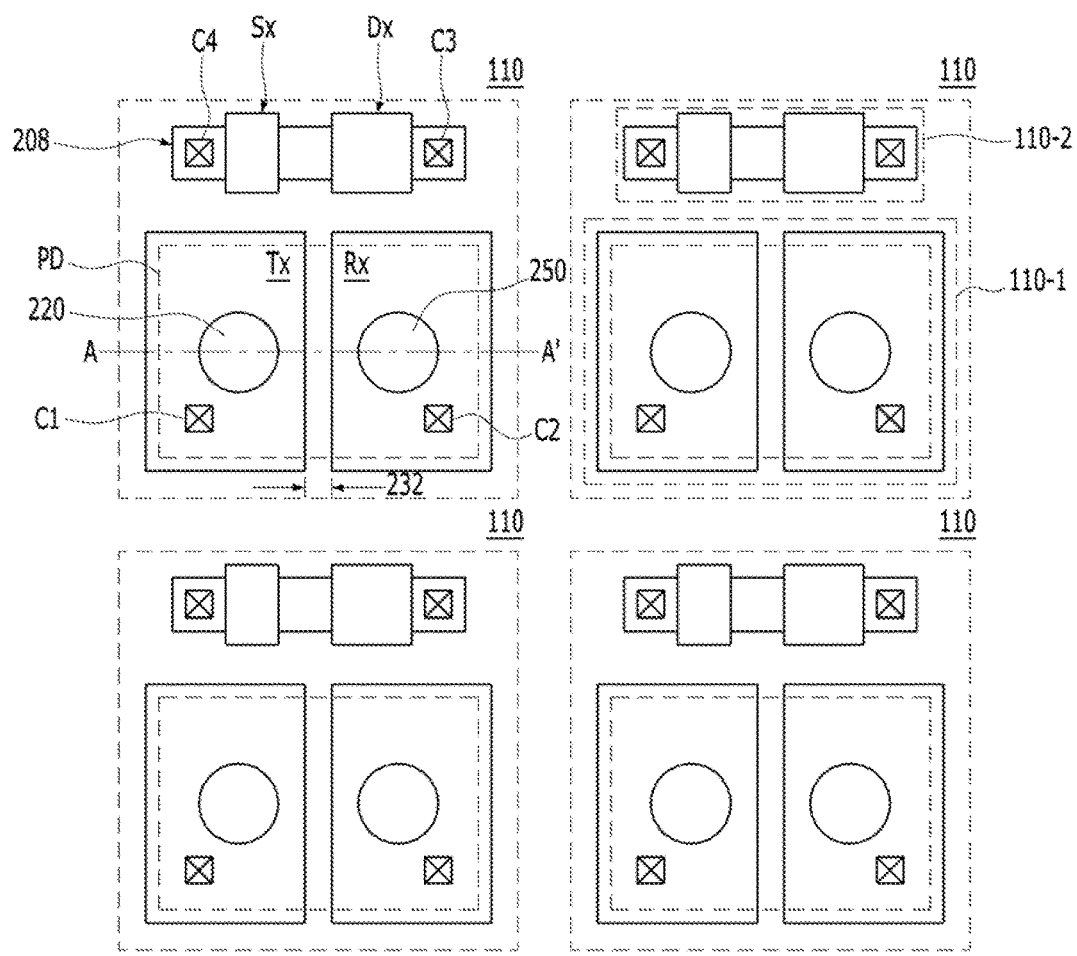
FIG. 2 is a plane view showing part of the pixel array of an image sensor in accordance with an embodiment of the present invention.
Figure 3:
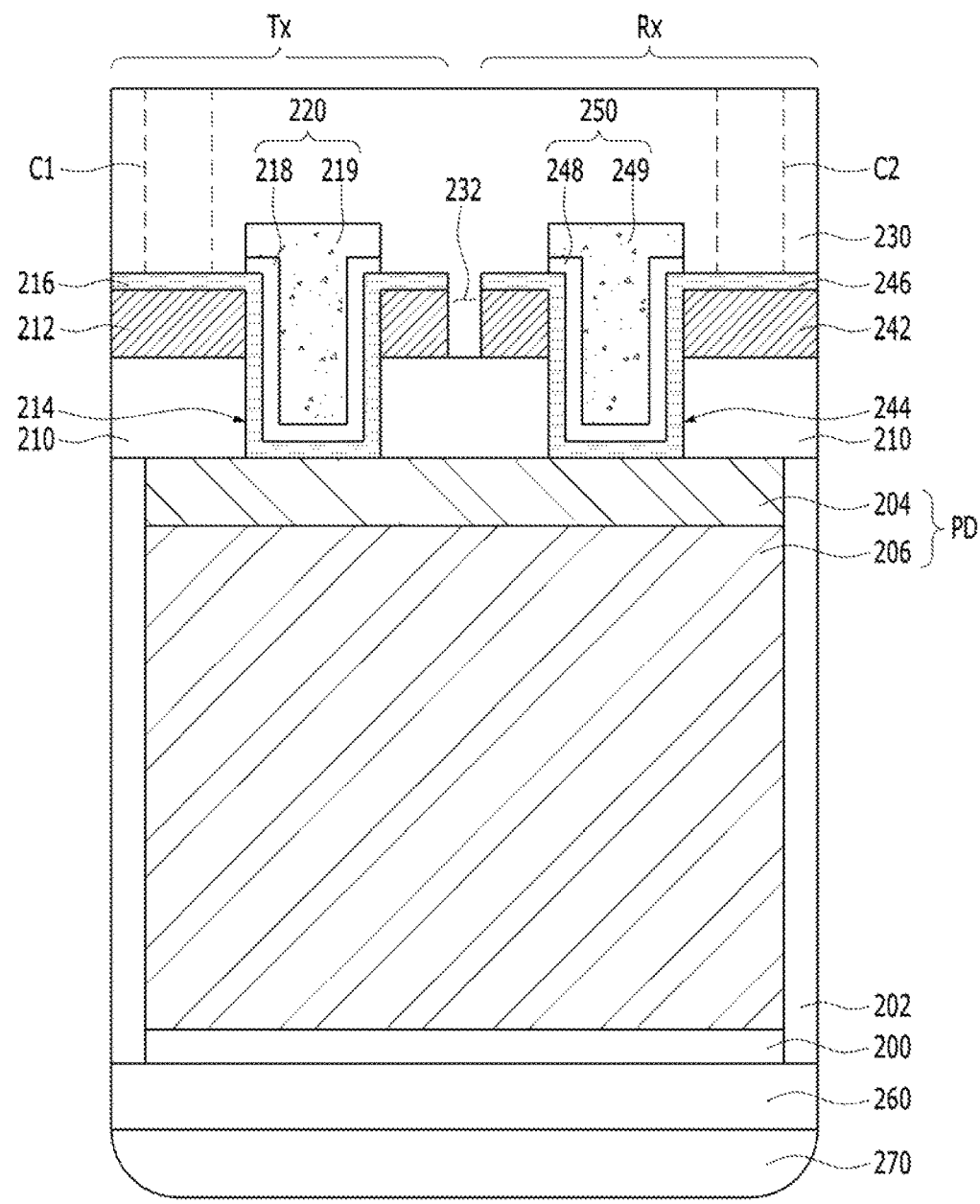
FIG. 3 is a cross-sectional view of the image sensor taken along the line A-A' of FIG. 2 in accordance with an embodiment of the present invention.
Figure 4:
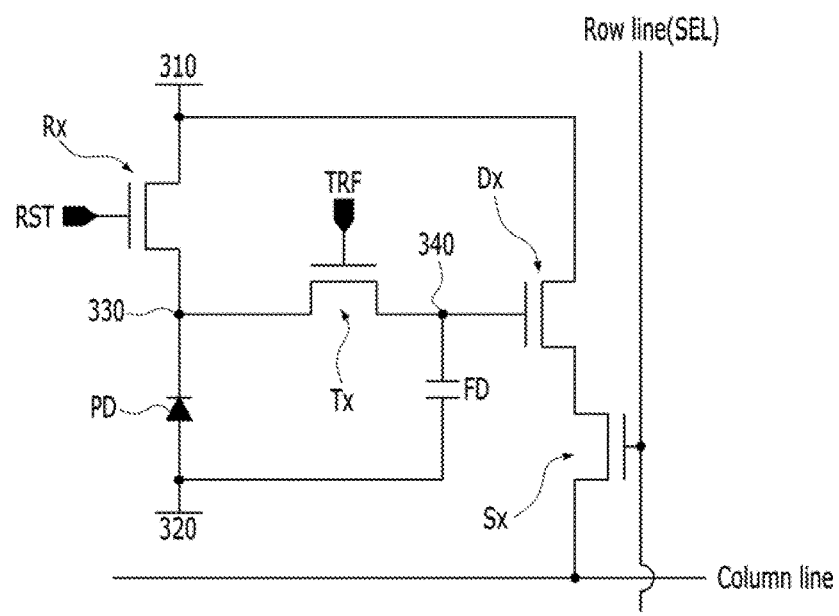
FIG. 4 is an equivalent circuit diagram of a unit pixel of an image sensor in accordance with an embodiment of the present invention.
Figure 5:
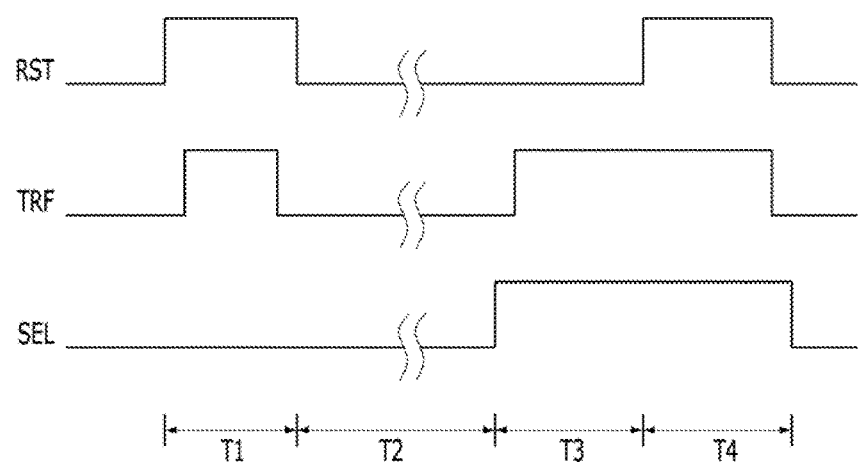
FIG. 5 is a schematic diagram illustrating operational timing of an image sensor in accordance with an embodiment of the present invention.

FIG. 2 is a plane view showing part of a pixel array of an image sensor in accordance with an embodiment of the present invention. FIG. 3 is a cross-sectional view of the image sensor taken along the line A-A' of FIG. 2 in accordance with an embodiment of the present invention. FIG. 4 is an equivalent circuit diagram of a unit pixel of an image sensor in accordance with an embodiment of the present invention. Furthermore, FIG. 5 is a schematic diagram illustrating operating timing of an image sensor in accordance with an embodiment of the present invention.

As shown in FIGS. 2 to 5, the image sensor in accordance with an embodiment may include a photoelectric conversion element PD, the transfer transistor Tx formed on the photoelectric conversion element PD, and the reset transistor Rx formed on the photoelectric conversion element PD and configured to be adjacent to the transfer transistor Tx with a gap 232 Interposed therebetween. In this case, the transfer transistor Tx and the reset transistor Rx may have a symmetrical structure based on the gap 232. The image sensor in accordance with an embodiment is described in more detail below.

First, a plane shape is described with reference to FIG. 2. In the image sensor in accordance with an embodiment, each of the unit pixels 110 may include a first region 110-1 and a second region 110-2. The first region 110-1 may include the photoelectric conversion element PD, the transfer transistor Tx, and the reset transistor Rx. The second region 110-2 may include an active region 208, the drive transistor Dx, and the selection transistor Sx. The first region 110-1 and the second region 110-2 may be separated from each other by an isolation structure 202.

In the first region 110-1, the transfer transistor Tx and the reset transistor Rx may be configured to overlap the photoelectric conversion element PD. The transfer transistor Tx and the reset transistor Rx may have a symmetrical form based on the gap 232 over the photoelectric conversion element D. More specifically, the transfer transistor Tx and the reset transistor Rx may have a left and right symmetrical form based on the gap 232. In this case, the gap 232 may have a line shape, which extends across the photoelectric conversion element PD in a column direction. In other words, the gap 232 may have a line shape which includes the central point of the photoelectric conversion element, extends in a column direction, and intersects the photoelectric conversion element PD. The photoelectric conversion element PD placed on one side of the gap 232 may have the same size as the photoelectric conversion element. PD placed on the other side of the gap 232. For reference, although not shown, the gap 232 may also extend in a row direction across the photoelectric conversion element PD.

The transfer transistor Tx may be electrically coupled to the floating diffusion FD and the drive transistor Dx through a first contact C1. Furthermore, the reset transistor Rx may be coupled to a first node 310 through a second contact C2. A first voltage may be supplied to the first node 310. In this case, the first voltage may be a power source voltage VDD or a voltage having a higher level than the power source voltage VDD. For reference, the first contact C1 and the second contact C2 may be symmetrically disposed with respect to the gap 323, but may be asymmetrically disposed in another embodiment.

In the second region 110-2, the drive transistor Dx has a gate coupled to the floating diffusion FD, and may generate an output voltage corresponding to the amount of charges stored in the floating diffusion FD, that is an image signal and an image reset signal. The selection transistor Sx has a gate coupled to a row line and may output an output voltage generated by the drive transistor Dx to a column line in response to a selection signal SEL.

The drive transistor Dx and the selection transistor Sx may be disposed to share a junction region, that is, a source region or a drain region. The gate of the drive transistor Dx may be greater size than the gate of the selection transistor Sx. The drive transistor Dx may be coupled to the first node 310, to which the first voltage is supplied, through a third contact C3 formed on one side of the active region 208. Furthermore an image signal and an image reset signal generated by the unit pixel 110 may be output to the column line through a fourth contact C4 formed on the other side of the active region 208.

A cross-sectional shape is described below with reference to FIG. 3. The image sensor in accordance with an embodiment may include a substrate 200. The photoelectric conversion element PD and the isolation structure 202 are formed in the substrate 200. The photoelectric conversion element PD and the active region 208 are formed in the substrate 200, separated from each other, and adjacent to each other.

The substrate 200 may include a semiconductor substrate. The semiconductor substrate may have a single crystal state and may include a silicon-containing material. That is, the substrate 200 may include a single crystal silicon-containing material. Furthermore, the substrate 200 may be a substrate that has been thinned through a thinning process. For example, the substrate 200 may be a bulk silicon substrate that has been thinned through a thinning process.

The isolation structure 202 may include a Shallow Trench Isolation (STI), a Deep Trench Isolation (DTI) or a potential barrier. The potential barrier may include an impurity region formed by doping impurities into the substrate 200. For example, the potential barrier may be a P type impurity region formed by doping boron, that is, P type impurities, into the substrate 200. The isolation structure 202 may include any one of the STI, the DTI, and the potential barrier or may include a combination thereof. For example, the isolation structure 202 surrounding the photoelectric conversion element PD may be the DTI or may have a structure in which the DTI and the potential barrier have been coupled. Furthermore, the isolation structure 202 configured to separate the photoelectric conversion element PD and the active region 208 may be the STI or may have a structure in which the STI and the potential barrier have been combined.

The photoelectric conversion element PD may include an organic or inorganic photodiode. For example, the photoelectric conversion element PD may include a first impurity region 204 and a second impurity region 206 which are formed in the substrate 200, have complementary conductive types, and have been vertically stacked. The first impurity region 204 may have a smaller thickness than the second impurity region 206. The first impurity region 204 and the second impurity region 206 may have been formed by implanting impurities into the substrate 200. More specifically, the first impurity region 204 may be a P type impurity region, and the second impurity region 206 may be an N type impurity region.

The image sensor in accordance with an embodiment may include the transfer transistor Tx and the reset transistor Rx which are formed on the photoelectric conversion element PD and configured to vertically overlap the photoelectric conversion element PD. The transfer transistor Tx and the reset transistor Rx may have the gap 232 over the photoelectric conversion element PD, may be adjacent to each other, and may have a symmetrical form based on the gap 232. A fill factor of the photoelectric conversion element PD can be maximized and the degree of integration of the unit pixels 110 can be easily improved since each of the transfer transistor Tx and the reset transistor Rx vertically overlaps the photoelectric conversion element PD as described above. Furthermore, image quality can be improved since the transfer transistor Tx and the reset transistor Rx are symmetrical to each other in structure, in shape, and in size.

The transfer transistor Tx may include an insulating layer 210 formed on the photoelectric conversion element PD, a first conductive layer 212 formed on the insulating layer 210, a first open portion 214 configured to expose the photoelectric conversion element PD through the insulating layer 210 and the first conductive layer 212, a first channel layer 216 formed along a surface of the first open portion 214 and coupled to the first conductive layer 212 and the photoelectric conversion element PD, and a transfer gate 220 formed on the first channel layer 216 and filling in the first open portion 214. The transfer gate 220 may include a first gate insulating layer 218 formed on the first channel layer 216 and a first gate electrode 219 formed on the first gate insulating layer 218 and filling in the first open portion 21.4

The first conductive layer 212 and the photoelectric conversion element PD may function as the junction region, that is, the source region and the drain region, of the transfer transistor Tx. More specifically, the first conductive layer 212 may function as the floating diffusion FD. The first channel layer 216 may function to electrically couple the photoelectric conversion element PD and the first conductive layer 212 in response to a transmission signal TRF applied to the transfer gate 220.

In an embodiment, the first channel layer 216 is formed on the first conductive layer 212 in addition to the bottom and side of the first open portion 214. However, the first channel layer 216 may have any shape so long as the first channel layer 216 is in contact with the photoelectric conversion element PD and the first conductive layer 212. For example, the first channel layer 216 may have a cylinder shape and be formed on the bottom and side of the first open portion 214.

The reset transistor Rx may include the insulating layer 210 formed on the photoelectric conversion element PD, a second conductive layer 242 formed on the insulating layer 210, a second open portion 244 configured to expose the photoelectric conversion element PD through the insulating layer 210 and the second conductive layer 242, a second channel layer 246 formed along a surface of the second open portion 244 and coupled to the second conductive layer 242 and the photoelectric conversion element PD, and a reset gate 250 formed on the second channel layer 246 and configured to gap-fill the second open portion 244. The reset gate 250 may include a second gate insulating layer 248 formed on the second channel layer 246 and a second gate electrode 249 formed on the second gate insulating layer 248 and configured to gap-fill at least the second open portion 244.

The second conductive layer 242 and the photoelectric conversion element PD may function as junction regions of the reset transistor Rx. The second channel layer 246 may electrically couple the photoelectric conversion element PD and the second conductive layer 242 in response to a reset signal RST applied to the reset gate 250. In FIG. 3, the second channel layer 246 is formed on the second conductive layer 242 in addition to the bottom and side of the second open portion 244. However, the second channel layer 246 may have any shape so long as the second channel layer 246 is in contact with the photoelectric conversion element PD and the second conductive layer 242. For example, the second channel layer 246 may have a cylinder shape and be formed on the bottom and side of the second open portion 244.

The insulating layer 210 may have a flat panel form and may have a greater area than the photoelectric conversion element PD. The channel length of the transfer transistor Tx and the reset transistor Rx may be controlled based on the thickness of the insulating layer 210. The insulating layer 210 may include oxide, nitride, oxynitride, and a combination thereof.

The first conductive layer 212 and the second conductive layer 242 may have a symmetrical structure with respect to the gap 232. More specifically, the first conductive layer 212 and the second conductive layer 242 may have a left and right symmetrical form based on the gap 232. Each of the first conductive layer 212 and the second conductive layer 242 may include a semiconductor material or a metallic material. For example, each, of the first conductive layer 212 and the second conductive layer 242 may include a silicon-containing material. The silicon-containing material may be polysilicon. N type impurities may have been doped into the polysilicon. The first conductive layer 212 and the second conductive layer 242 may have been formed at the same time and include the same material as each other.

The first open portion 214 and the second open portion 244 may have a symmetrical structure with respect to the gap 232. More specifically, the first open portion 214 and the second open portion 244 may have a left and right symmetrical form with respect to the gap 232. In the first open portion 214 and the second open portion 244, a channel layer and a gate will be formed. The first open portion 214 and the second open portion 244 may have various plane shapes. For example, the plane shape of each of the first open portion 214 and the second open portion 244 may be a polygon, circle, or oval. Each of the first open portion 214 and the second open portion 244 may have vertical sidewalls or may have inclined sidewalls of which an internal line width is reduced toward the photoelectric conversion element PD.

The first open portion 214 and the second open portion 244 may be formed at the same time and have the same shape as each other. In an embodiment, the number of each of the first open portions 214 and the second open portions 244 may be one as shown in FIG. 3, but the number of each of the first open portions 214 and the second open portions 244 is not limited thereto. That is, the number of each of the first open portions 214 and the second open portions 244 may be more than one. As the number of each of the first open portions 214 and the second open portions 244 increases, the channel width of the transfer transistor Tx and the reset transistor Rx may be increased.

The first channel layer 216 and the second channel layer 246 may have a symmetrical structure with respect to the gap 232. More specifically, the first channel layer 216 and the second channel layer 246 may have a left and right symmetrical form with respect to the gap 232. The first channel layer 216 and the second channel layer 246 may have been formed at the same time and have the same material as each other. Each of the first channel layer 216 and the second channel layer 246 may include a silicon-containing material. For example, each of the first channel layer 216 and the second channel layer 246 may include polysilicon. More specifically, each of the first channel layer 216 and the second channel layer 246 may include undoped polysilicon, P type polysilicon, or N type polysilicon.

When the first channel layer 216 and the second channel layer 246 include undoped polysilicon or P type polysilicon, the transfer transistor Tx and the reset transistor Rx may operate in an enhancement mode in which a channel maintains an inactive state in an off state. In contrast, when the first channel layer 216 and the second channel layer 246 include N type polysilicon, the transfer transistor Tx and the reset ns star Rx may operate in a depletion mode in which a channel maintains an active state in the off state. When the transfer transistor Tx and the reset transistor Rx operate in a depletion mode, image quality can be improved more effectively in a low illuminance environment.

The transfer gate 220 and the reset gate 250 may have a symmetrical structure with respect to the gap 232. More specifically, the transfer gate 220 and the reset gate 250 may have a left and right symmetrical form with respect to the gap 232. The transfer gate 220 and the reset gate 250 may have been formed at the same time and include the same material as each other. More specifically, the first gate insulating layer 218 and the second gate insulating layer 248 may have been formed at the same time and include the same material as each other. Each of the first gate insulating layer 218 and the second gate insulating layer 248 may include oxide, nitride, oxynitride, or a combination thereof. The first gate electrode 219 and the second gate electrode 249 may have been formed at the same time and include the same material as each other, Each of the first gate electrode 219 and the second gate electrode 249 may include a semiconductor material or a metallic material.

The image sensor in accordance with an embodiment may include an interlayer dielectric layer 230 formed over the substrate 200 and configured to cover the transfer transistor Tx and the reset transistor Rx, a color separation element 260 formed on an incident surface through which incident light is incident on the photoelectric conversion element PD, and a light focusing element 270 formed on the color separation element 260.

The interlayer dielectric layer 230 may include oxide, nitride, oxynitride, or a combination thereof. The first contact C1 may be coupled to the first conductive layer 212 through the interlayer dielectric layer 230, and the second contact C2 may be coupled to the second conductive layer 242 through the interlayer dielectric layer 230. The color separation element 260 may include a color filter. The color filter may include a red filter, a green filter, a blue filter, a cyan filter, a yellow filter, a magenta filter, a white filter, a black filter, an IR cutoff filter, etc. The light focusing element 270 may include a digital lens or a hemispherical lens.

Referring to FIG. 4, the equivalent circuit diagram of the unit pixel 110 of the image sensor in accordance with an embodiment may include a third node 330 coupled between a first node 310 set as a first voltage and a second node 320 set as a second voltage. The first voltage may have a higher level than the second voltage. For example, the first voltage may be a power source voltage VDD or a voltage having a higher level than the power source voltage VDD. The second voltage may be a ground voltage VSS. The reset transistor Rx may be coupled between the first node 310 and the third node 330, and the photoelectric conversion element PD may be coupled between the third node 330 and the second node 320. The reset signal RST may be applied to the gate of the reset transistor Rx.

One side of the transfer transistor Tx may be coupled the third node 330, and the other side thereof may be coupled to the gate of the drive transistor Dx. A fourth node 340 may be coupled between the other side of the transfer transistor Tx and the gate of the drive transistor Dx. The floating diffusion FD may be coupled between the second node 320 and the fourth node 340. That is, the fourth node 340 may function as a floating diffusion node. The transmission signal TRF may be applied to the gate of the transfer transistor Tx.

One side of the drive transistor Dx may be coupled to the first node 10 and the other side thereof may be coupled to the selection transistor Sx. The gate of the selection transistor Sx may be coupled the row line, and one side and the other side of the selection transistor Sx may be coupled to the column line and the drive transistor Dx, respectively. The selection signal SEL may be applied to the selection transistor Sx through the row line.

A method for driving the image sensor in accordance with an embodiment is described below with reference to FIG. 5 During a first section T1, the reset transistor Rx and the transfer transistor Tx are activated by applying the reset signal RST and the transmission signal TRF, thereby resetting the fourth node 340, that is, the floating diffusion FD. Next, the reset transistor Rx and the transfer transistor Tx are turned off. During a second section T2, photocharges are generated by radiating incident light to the photoelectric conversion element PD. The second section T2 is also called an integration time.

Next, during a third section T3, the selection transistor Sx and the transfer transistor Tx are activated by applying the selection signal SEL and the transmission signal TRF, respectively. When the transfer transistor Tx is activated, the photocharges generated from the photoelectric conversion element PD during the second section T2 are transferred and stored in the floating diffusion FD. The drive transistor Dx generates an output voltage corresponding to the amount of photocharges stored in the floating diffusion FD that is, an image signal. The generated image signal may be output to the column line through the selection transistor Sx.

Next, the selection transistor Sx and the transfer transistor Tx are maintained activated during a fourth section T4. The reset transistor Rx is also activated by applying the reset signal RST. When the reset transistor Rx is activated and all of the photocharges stored in the floating diffusion FD have exited, the drive transistor Dx generates an output voltage, corresponding to the state in which the floating diffusion FD has been reset, that is, an image reset signal, and may output the generated image reset signal to the column line through the selection transistor Sx.

As described above, the image sensor in accordance with an embodiment can effectively remove the distortion of analog data which is generated when a signal applied to the gates of the reset transistor Rx and the transfer transistor Tx is changed. Accordingly, data according to photocharges generated by the photoelectric conversion element PD can be output without distortion, and thus a high quality of image can be provided.

In the aforementioned embodiment, the gap 232 between the transfer transistor Tx and the reset transistor Rx have a symmetrical structure to each other, are provided on the photoelectric conversion element PD, and are illustrated as having a line shape extending in the row direction or the column direction. In a modified example, the gap 232 may have a line shape extending in a diagonal direction between the row direction and the column direction. This is described below with reference to FIGS. 6a and 6b.

Figure 6A:
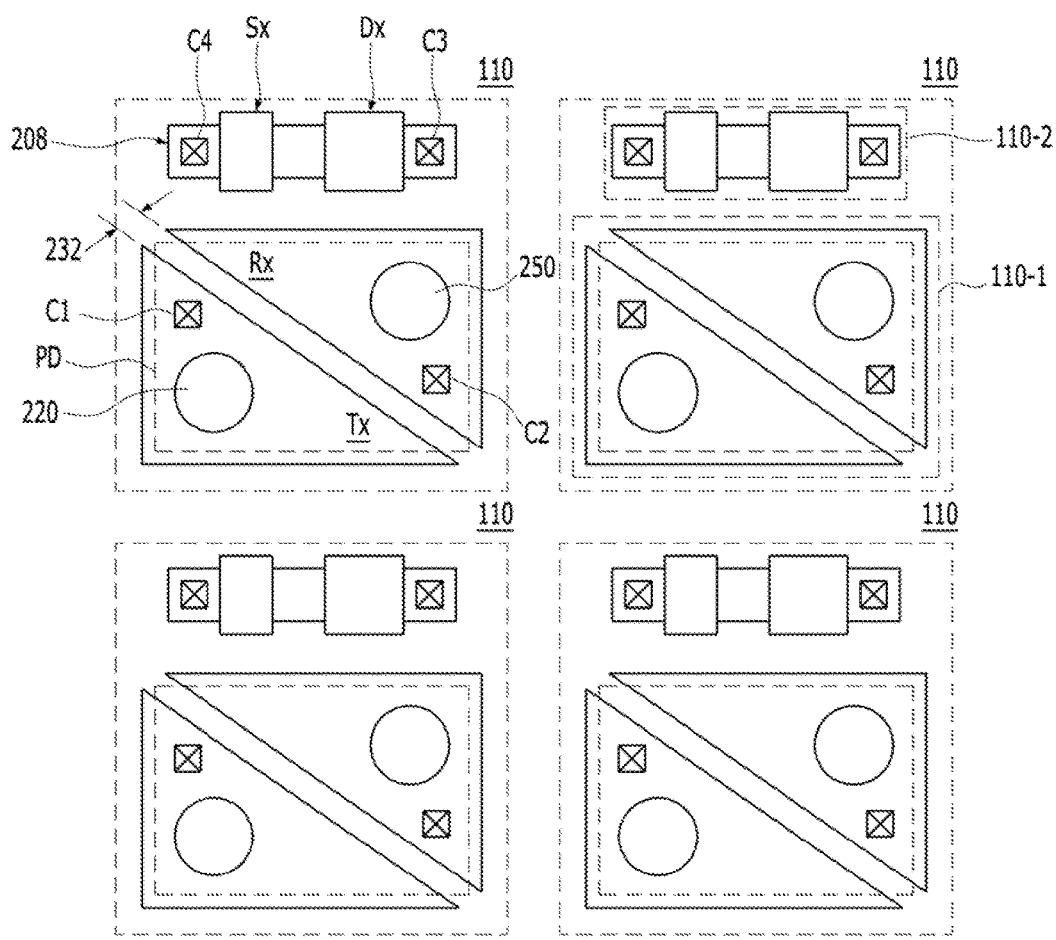
FIGS. 6a and 6b are plane views illustrating part of a pixel array of an image sensor in accordance with a modified example.
Figure 6B:
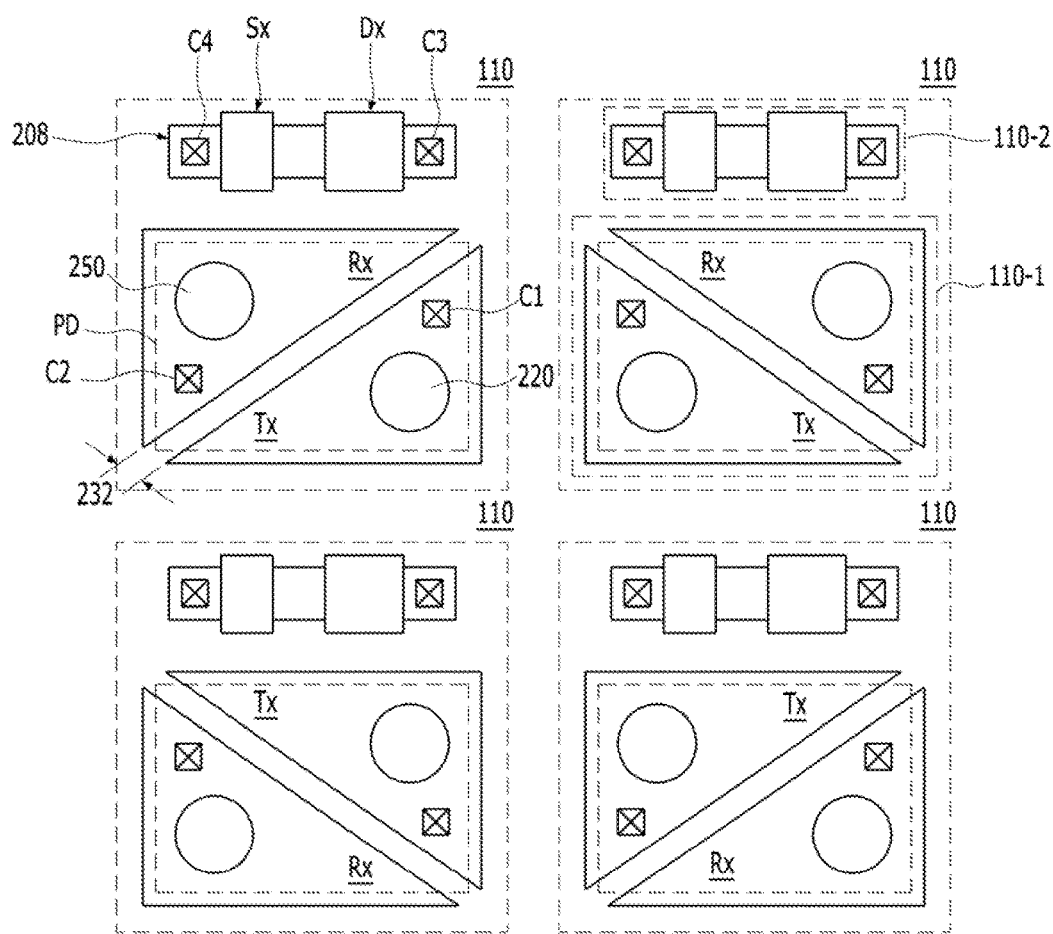

As shown in FIGS. 6a and 6b, the image sensor in accordance with a modified example may include the photoelectric conversion element PD, the transfer transistor Tx formed on the photoelectric conversion element PD, and the reset transistor Rx formed on the photoelectric conversion element PD and adjacent to the transfer transistor Tx with the gap 232 interposed therebetween. In this case, the transfer transistor Tx and the reset transistor Rx may have a symmetrical structure based on the gap 232. More specifically, the transfer transistor Tx may be congruent or similar to the reset transistor Rx when rotated 180° with respect to the gap 232.

As shown in FIG. 6a, in each of the plurality of unit pixels 110, the gap 232 may have a line shape and extend in a diagonal direction. In the plurality of unit pixels 110, all of the gaps 232 may have line shapes and extend in the same direction. In this case, the gap 232 may extend across the middle of the photoelectric conversion element PD in the diagonal direction. The gap 232 may include the central point of the photoelectric conversion element PD. The area of the photoelectric conversion element PD placed on one side of the gap 232 and the area of the photoelectric conversion element PD placed on the other side of the gap 232 may be the same as each other in size.

As shown in FIG. 6b, in each of the plurality of unit pixels 100 the gap 232 has a line shape and extends in a diagonal direction. However, in the unit pixels 100, the directions in which the gaps 232 have been extended may be different from FIG. 6a. For example a plurality of the gaps 232 adjacent to each other in the pixel array may be disposed to have a diamond shape. Although not shown this shape facilitates the design of wires coupled to the first contact C1 and the second contact C2 and s coupled to the transfer gate 220 and the reset gate 250. Furthermore, the shape shown in FIG. 6b may be easily applied to an image sensor having a pixel sharing structure.

The image sensor in accordance with an embodiment of the present invention may be used in various electronic devices or systems. Hereafter, a camera including an image sensor in accordance with an embodiment of the present invention will be described with reference to FIG. 7.

Figure 7:
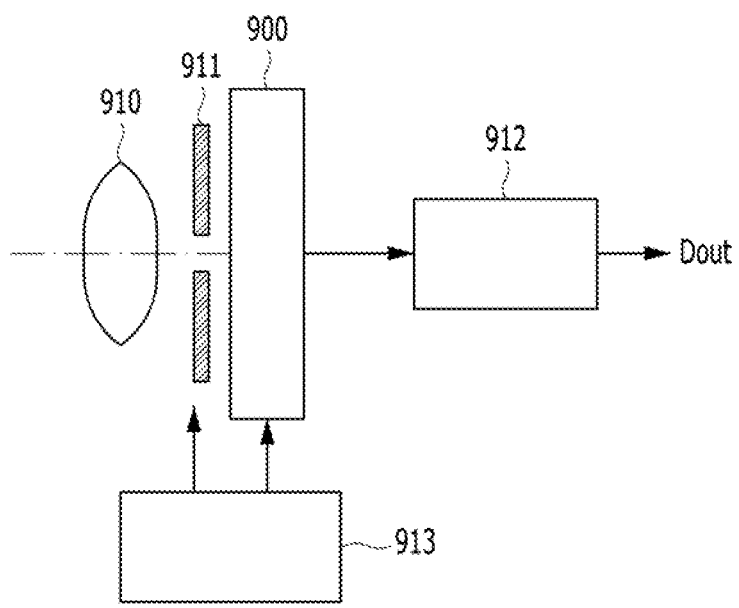
FIG. 7 is a diagram schematically illustrating an electronic device including an image sensor in accordance with an embodiment of the present invention.

FIG. 7 is a diagram schematically illustrating an electronic device including an image sensor in accordance with an embodiment of the present invention. Referring to FIG. 7, the electronic device including the image sensor in accordance with an embodiment of the present invention may be a camera capable of taking a still age or a moving image. The electronic device may include an optical system or optical lens 910, a shutter unit 911, a driving unit 913 for controlling/driving the image sensor 900 and the shutter unit 911, and a signal processing unit 912.

The optical system 910 may guide image light from an object to the pixel array 100 of the image sensor 900. The optical system 910 may include a plurality of optical lenses. The shutter unit 911 may control a light irradiation period and a light shield period for the image sensor 900. The driving unit 913 may control a transmission operation of the image sensor 900 and a shutter operation of the shutter unit 911. The signal processing unit 912 may process signals outputted from the Image sensor 900 in various manners. The processed image signals Dout may be stored in a storage medium such as a memory or outputted to a monitor or the like.

The present embodiments may increase a degree of integration since the transfer transistor and the reset transistor are configured to overlap the photoelectric conversion element.

Furthermore, an image of high quality can be provided since the transfer transistor and the reset transistor are symmetrical to each other in structure.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
   a photoelectric conversion element;
   a transfer transistor formed over the photoelectric conversion element; and
   a reset transistor formed over the photoelectric conversion element, formed substantially at the same level as the transfer transistor, and spaced apart from the transfer transistor by a gap,
   wherein the transfer transistor and the reset transistor are trench-type transistors and are symmetrical structure to each other with respect to the gap,
   wherein the photoelectric conversion element located under the transfer transistor has the same size as the photoelectric conversion element located under the reset transistor.

2. The image sensor of claim 1,
   wherein the transfer transistor comprises:
      a first insulating layer formed over the photoelectric conversion element;
      a first conductive layer formed over the first insulating layer;
      a first open portion formed through the first insulating layer and the first conductive layer to expose the photoelectric conversion element;
      a first channel layer formed in the first open portion, and contacting the photoelectric conversion element and the first conductive layer; and
      a first gate formed over the first channel layer, and
   wherein the reset transistor comprises:
      a second insulating layer formed over the photoelectric conversion element;
      a second conductive layer formed over the second insulating layer;
      a second open portion formed through the second insulating layer and the second conductive layer to expose the photoelectric conversion element;
      a second channel layer formed in the second open portion and contacting the photoelectric conversion element and the second conductive layer; and
      a second gate formed over the second channel layer.

3. The image sensor of claim 2, wherein the first gate comprises:
   a first gate insulating layer formed over the first channel layer; and
   a first gate electrode formed over the first gate insulating layer and filling the first open portion, and
   wherein the second gate comprises:
      a second gate insulating layer formed over the second channel layer; and a second gate electrode formed over the second gate insulating layer and filling the second open portion.

4. The image sensor of claim 2, wherein the first channel layer comprises undoped polysilicon or P type polysilicon, and
wherein the second channel layer comprises undoped polysilicon or P type polysilicon.

5. The image sensor of claim 2, wherein the first channel layer comprises N type polysilicon, and
wherein the second channel layer comprises N type polysilicon.

6. The image sensor of claim 1, wherein the gap is formed over the photoelectric conversion element and has a line shape which comprises a central point of the photoelectric conversion element and extends in a row direction, or column direction.

7. The image sensor of claim 1, wherein the gap is formed over the photoelectric conversion element and has a line shape which comprises a central point of the photoelectric conversion element and extends in a diagonal direction.

8. An image sensor, comprising:
a photoelectric conversion element;
an insulating layer formed over the photoelectric conversion element;
a first conductive layer formed over the insulating layer;
a second conductive layer formed over the insulating layer, formed at the same level as the first conductive layer, spaced apart from the first conductive layer by a gap, and configured symmetrical to the first conductive layer with respect to the gap;
a first open portion formed through the first conductive layer and the insulating layer to expose the photoelectric conversion element;
a second open portion formed through the second conductive layer and the insulating layer to expose the photoelectric conversion element, and configured symmetrical to the first open portion with respect to the gap;
a first channel layer formed in the first open portion and contacting the photoelectric conversion element and the first conductive layer;
a second channel layer formed in the second open portion, contacting the photoelectric conversion element and the second conductive layer, and configured symmetrical to the first channel layer with respect to the gap;
a transfer gate formed over the first channel layer and filling the first open portion; and
a reset gate formed over the second channel layer, filling the second open portion, and configured symmetrical to the transfer gate with respect to the gap.

9. The image sensor of claim 8,
wherein the transfer gate comprises:
a first gate insulating layer formed over the first channel layer; and
a first gate electrode formed over the first gate insulating layer and filling the first open portion, and
wherein the reset gate comprises:
a second gate insulating layer formed over the second channel layer; and
a second gate electrode formed over the second gate insulating layer and filling the second open portion.

10. The image sensor of claim 8,
wherein the first conductive layer and the second conductive layer are formed of the same material as each other,
wherein the first channel layer and the second channel layer are formed of the same material as each other, and
wherein the transfer gate and the reset gate are formed of the same material as each other.

11. The image sensor of claim 8, wherein each of the first channel layer and the second channel layer includes undoped polysilicon or P type polysilicon.

12. The image sensor of claim 8, wherein each of the first channel layer and the second channel layer includes N type polysilicon.

13. The image sensor of claim 8, wherein the photoelectric conversion element covered by the first conductive layer has the same size as the photoelectric conversion element covered by the second conductive layer.

14. The image sensor of claim 13, wherein the gap is formed over the photoelectric conversion element and has a line shape which comprises a central point of the photoelectric conversion element and extends in a row direction, column direction or diagonal direction.

15. The image sensor of claim 13, wherein the gap is formed over the photoelectric conversion element and has a line shape which comprises a central point of the photoelectric conversion element and extends in a diagonal direction.

* * * * *